(12) United States Patent
Ingenbleek et al.

(10) Patent No.: US 8,233,268 B2
(45) Date of Patent: Jul. 31, 2012

(54) SEALING A CONTROL DEVICE

(75) Inventors: Robert Ingenbleek, Kressbronn (DE); Michael Schwab, Markdorf (DE); Marc Abele, Ueberlingen (DE); Thomas Betz, Leingarten (DE); Rolf Zoeller, Brackenheim (DE); Andreas Rekofsky, Regensburg (DE)

(73) Assignees: ZF Friedrichshanfen AG, Friedrichshafen (DE); Continental Automotive GmbH, Hannover (DE); Walter Soehner GmbH & Co. KG, Schwaigern (DE)

( * ) Notice: Subject to any disclaimer, the term of this patent is extended or adjusted under 35 U.S.C. 154(b) by 884 days.

(21) Appl. No.: 12/158,246

(22) PCT Filed: Dec. 8, 2006

(86) PCT No.: PCT/EP2006/011807
§ 371 (c)(1),
(2), (4) Date: Dec. 29, 2008

(87) PCT Pub. No.: WO2007/073844
PCT Pub. Date: Jul. 5, 2007

(65) Prior Publication Data
US 2009/0168309 A1 Jul. 2, 2009

(30) Foreign Application Priority Data
Dec. 19, 2005 (DE) .......................... 10 2005 061 050

(51) Int. Cl.
*H05K 5/00* (2006.01)
*H05K 7/00* (2006.01)

(52) U.S. Cl. .................... 361/679.01; 361/714; 361/736; 361/752; 257/726; 439/485

(58) Field of Classification Search ............. 361/679.01, 361/714, 736, 752; 257/726; 439/485
See application file for complete search history.

(56) References Cited

U.S. PATENT DOCUMENTS

| 3,996,914 | A | * | 12/1976 | Crall et al. ................. 123/198 E |
| 4,192,520 | A | * | 3/1980 | Hasegawa ..................... 277/591 |
| 4,225,970 | A | * | 9/1980 | Jaramillo et al. ............ 455/90.3 |
| 5,061,193 | A | * | 10/1991 | Seaman ........................ 439/76.1 |
| 5,199,239 | A | * | 4/1993 | Younger ....................... 52/592.5 |
| 5,418,685 | A | * | 5/1995 | Hussmann et al. ........... 361/719 |
| 7,193,852 | B2 | * | 3/2007 | Wetzel ........................... 361/714 |

FOREIGN PATENT DOCUMENTS

| DE | 2551360 | 5/1977 |
| DE | 8705592 | 6/1987 |
| DE | 29823961 | 6/1990 |
| DE | 4205442 | 11/1992 |
| DE | 4324913 | 11/1994 |

(Continued)

*Primary Examiner* — Anthony Haughton
(74) *Attorney, Agent, or Firm* — Leydig, Voit & Mayer, Ltd.

(57) ABSTRACT

A housing comprising at least one electrical connection through a housing wall that is particularly inexpensive to produce and allows the electronic components located on the internal face and the external face of the housing to be attached in a particularly variable manner. The electrical connection is directly surrounded by housing material while being additionally sealed by means of sealing material. The inventive housing seal is provided with a profiled seal encompassing at least two sealing lips. The sealing material is additionally used for sealing the cover and/or the bottom relative to the housing wall. The arrangement is also particularly well protected against oil and other aggressive media as a combination of housing material and sealing material is used for surrounding the electrical connection.

8 Claims, 2 Drawing Sheets

FOREIGN PATENT DOCUMENTS

| | | |
|---|---|---|
| DE | 19914469 | 6/2000 |
| DE | 10324126 | 12/2004 |
| DE | 10340974 | 3/2005 |
| DE | 102004033559 | 2/2006 |
| EP | 0375271 | 6/1990 |
| EP | 0488879 | 6/1992 |
| EP | 0777407 | 6/1997 |
| EP | 1154615 | 11/2001 |
| FR | 2831384 | 4/2003 |
| GB | 1539261 | 1/1979 |

\* cited by examiner

SEALING A CONTROL DEVICE

CROSS REFERENCE TO PRIOR APPLICATIONS

This application is a U.S. National Phase application under 35 U.S.C. §371 of International Application No. PCT/EP2006/011807, filed on Dec. 8, 2006 and claims benefit to German Patent Application No. DE 10 2005 061 050.1, filed on Dec. 19, 2005. The International Application was published in German on Jul. 5, 2007 as WO 2007/073844 under PCT Article 21 (2).

The present invention relates to a housing for an electronic control device.

BACKGROUND

Control devices usually have many electronic components that are connected to other components outside of the control device. In order to protect control devices from environmental influences or mechanical loads, they are normally installed in housings. So as to still allow a connection to components located outside of the housing, an electric connection from the inside to the outside of the housing is needed.

European specification EP 0 375 271 B1 describes such an electric connection. This connection is provided by a supporting plate onto which conductors are printed. The board thus produced is placed at the connection site between a housing and a cover, and it is sealed off with respect to the housing and the cover by means of molded seals. An electronic component inside the housing is connected via conducting wires to the conductors that are printed on the supporting plate. On the outside of the housing, in turn, conducting wires are soldered onto the printed conductors and these wires allow the connection to a component situated the outside of the housing.

A disadvantage of such an arrangement is that the printed conductors cannot be plugged in, in other words, that they cannot be connected directly to other components via a plug-in connection. For this reason, when printed conductors are used, many interfaces are needed since the conductors on the board have to be connected via additional conducting wires to the appertaining electric components. In this context, each interface constitutes a potential source of error. Moreover, the production of a printed conductor on a board is cost-intensive. Furthermore, the spatial arrangement of the interfaces can only be changed by installing a new board. In addition, the connection of the board to the appertaining electric components via individual conducting wires is vulnerable to vibrations.

SUMMARY OF THE INVENTION

In order to circumvent these drawbacks, DE 10 2004 033 559.1 of the applicant, which had not yet been published at the point in time of this application, proposes a seal for a housing which allows an electric connection to pass through the housing wall in a tightly sealed manner. The proposal is made for the housing to be configured with a double wall and for the electric connection to be tightly surrounded by the housing wall. A sealing material is filled into the hollow space between the two housing wall parts. This sealing material seals off the passage for the electric connection through the housing wall and also seals off the housing wall with respect to the cover and/or the bottom. However, high-quality sealing material is needed to create this seal. The entire disclosure of DE 10 2004 033 559.1, is incorporated by reference into the disclosure of the present application.

An object of the present invention is to provide a housing with an electric connection through a housing wall and to further improve the seal.

The present invention provides a housing in which an electric connection is passed through a housing wall and is tightly surrounded by the housing wall. The housing wall has a hollow space that is filled with sealing material. This hollow space is formed by the interstice of a double-walled housing and is open in the direction of a cover and/or the bottom. According to the invention, the sealing material is configured in such a way that it constitutes a sealing profile with at least two sealing lips on the side of the hollow space oriented towards the cover and/or the bottom.

A first sealing lip may be configured in such a manner that it is oriented in the direction of a closing movement with which the cover and/or the bottom is placed onto the end of the housing wall. The direction of the closing movement is advantageously oriented perpendicular to the end of the housing wall, but it can also diverge from this. The cross section of the sealing profile shows that the first sealing lip is arranged in the center. Furthermore, at least one second sealing lip is arranged to the left and/or to the right of the first sealing lip. This second sealing lip does not extend parallel, but rather obliquely to the first sealing lip, whereby the free end of the second sealing lip faces away from the first sealing lip.

The first sealing lip also may have a cross section that increases towards the housing wall. The second sealing lip has a cross section that remains essentially constant and is much smaller than its length. When the cover and/or the bottom is placed onto the end of the housing, pressure may be exerted axially onto the first sealing lip, in the direction of the closing movement and in the direction of its extension. This pressure is transferred to the electric connection except for any losses that might occur. The second sealing lip may be subjected to bending stress due to that fact that it is oriented obliquely to the direction of the closing movement and due to its relatively thin cross section. In an advantageous embodiment, the second sealing lip is bent in such a way that its free end is displaced towards the end of the housing wall. At the same time, the free end moves away from the first sealing lip while it is being bent, in other words, perpendicular to the direction of the closing movement. Of course, the second sealing lip can also be arranged differently, which would result in a divergent movement.

The first sealing lip has a function of sealing off the passage for the electric connection through the housing wall. An advantage of this configuration is that the first sealing lip transfers its pressure load very efficiently in the direction of the electric connection, thereby sealing it.

Owing to the cross section of the second sealing lip, which is much smaller than its length, and in part due to its orientation obliquely to the direction of the closing movement, the strains built up in the second sealing lip as a result of the load exerted by the closing movement are much lower than in the first sealing lip. Consequently, the sealing material in the area of the second sealing lip is less stressed than in the area of the first sealing lip. The magnitude of the load exerted onto the sealing material determines whether the sealing material undergoes an elastic or a plastic deformation. With the embodiment according to the invention, in an advantageous manner, the deformation of the second sealing lip due to load is elastic, even if the deformation of the first sealing lip is already partially plastic under this load. The second sealing lip allows a tight sealing of the cover and/or the bottom with respect to the housing wall, even if the first sealing lip undergoes partial plastic deformation under this load. The passage for the electric connection through the housing wall is advantageously sealed off primarily by the pressure load that is transferred via the first sealing lip. As a result, a sealing material with a higher compression set can be employed than in the case of seals which, due in part to their configuration, are only pressure-loaded.

Mainly elastomers and thermoplastic elastomers are used as the materials for the seal. In this context, elastomers usually have a compression set of less than 20% while the compression set of thermoplastic elastomers is usually higher. Through the advantageous configuration of the sealing profile, elastomers, especially also thermoplastic elastomers, can be used for the objective according to the invention. Sealing profiles having more than two sealing lips can also be employed. For example, another advantageous embodiment of the invention is configured with a first and two second sealing lips, whereby one of the second sealing lips is arranged to the left and the other second sealing lip is arranged to the right of the first sealing lip as seen in a cross section of the sealing profile.

BRIEF DESCRIPTION OF THE DRAWINGS

For purposes of further elucidating the invention as well as the embodiments, two schematic drawings accompany the description. These show the following.

DETAILED DESCRIPTION

Figure 1:
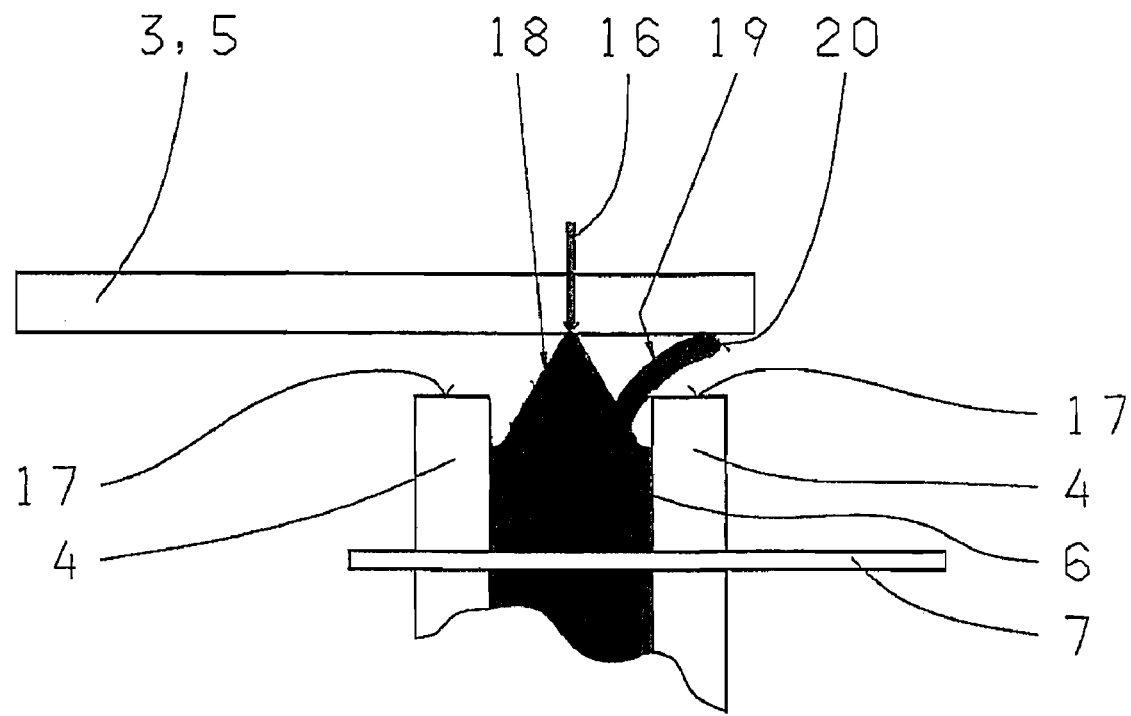
FIG. 1—a section through a housing according to the invention.

FIG. 1 shows part of a housing having a double-wall housing wall 4. An electric connection 7, which is tightly surrounded by the housing wall 4, passes through the housing wall 4. The sealing material 6 can be seen in the hollow space between the two walls of the housing wall 4. A cover 3 is placed in the direction 16 of a closing movement onto the end 17 of the housing wall 4. A first sealing lip 18 is oriented in the direction 16 of the closing movement. Here, the cross section of the first sealing lip 18 increases towards the housing wall 4, whereby here, the first sealing lip 18 has more or less the shape of a triangle with straight flanks. The second sealing lip 19 is oriented obliquely to the direction 16 of the closing movement. The cross section of the second sealing lip 19 is constant and much smaller than its length. The free end 20 of the second sealing lip 19 faces away from the first sealing lip 18.

When the cover 3 is placed onto the housing wall 4 in the direction 16 of the closing movement, then pressure is exerted onto the first sealing lip 18 in the direction 16 of the closing movement. This pressure is transferred to the electric connection 7 by the first sealing lip 18 except for any losses that might occur. The second sealing lip 19 is especially bent by the load resulting from the closing movement. The free end 20 of the second sealing lip 19 is moved in the direction of the end 17 of the housing wall 4. Moreover, it is moved away from the first sealing lip 18, in other words, perpendicular to the direction 16 of the closing movement. As shown in FIG. 1, the seal can face the cover 3 and/or the bottom 5.

Figure 2:
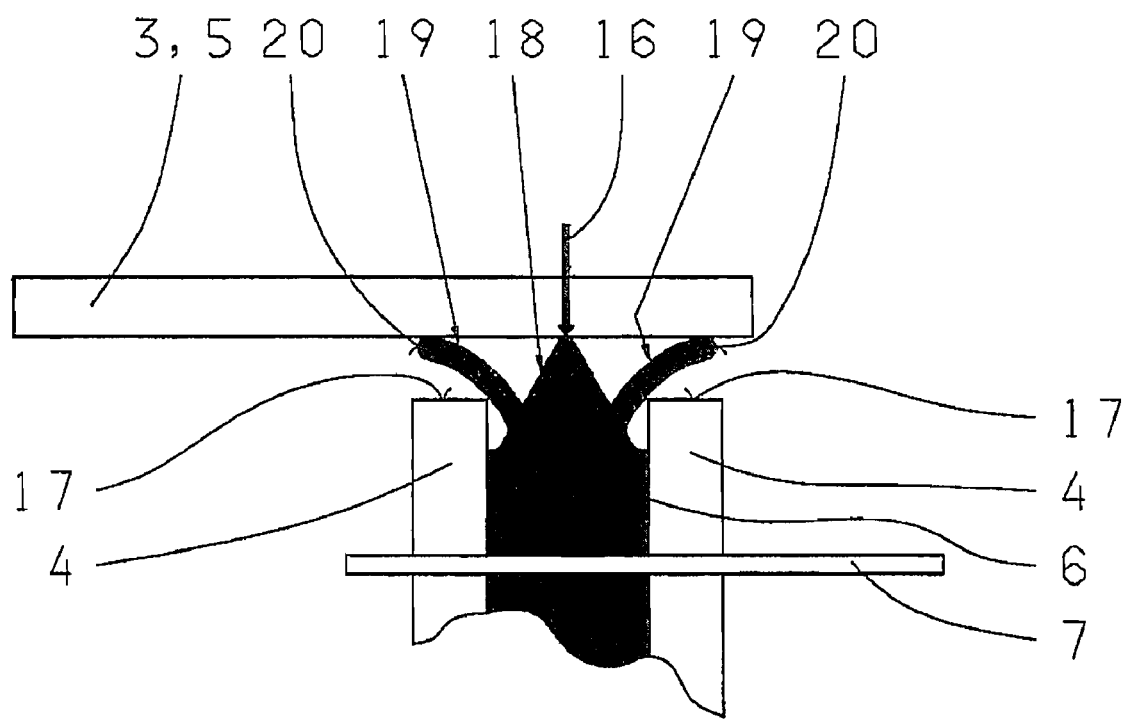
FIG. 2—a section through another housing according to the invention.

FIG. 2 corresponds essentially to FIG. 1, whereby the sealing profile has a first sealing lip 18 and a second sealing lip 19. Both sealing principles are retained here. Pressure is exerted on the first sealing lip 18 and it especially seals off the passage for the electric connection 7. The two second sealing lips 19 are subjected to bending stress and they seal off the housing 4 with respect to the cover 3 or the bottom 5. The same reference numerals are used to designate the same components.

The invention claimed is:

1. A housing for an electronic device comprising:
at least one housing wall defining a housing inside and a housing outside, the housing wall including a hollow space;
a cover configured to be disposed on an end of the at least one housing wall in a closing direction;
at least one electrical connection electrically connecting the housing inside with the housing outside and passing through the hollow space and through a passage in the housing wall such that the housing wall sheaths the electrical connection; and,
a sealing material disposed in the hollow space and sealing off the passage and extending beyond an end of the housing wall toward the cover so as to seal off the end of the housing wall using the cover and wherein the sealing material forms at least two sealing lips on a side facing the cover, the at least two sealing lips including a first sealing lip extending from the end of the housing wall in a direction parallel to the closing direction and a second sealing lip extending from the end of the housing wall obliquely to the closing direction.

2. The housing as recited in claim 1, wherein the cover is a housing bottom.

3. The housing as recited in claim 1, wherein the first sealing lip has a cross-sectional area that increases in a direction toward the housing wall and wherein the second sealing lip has a relatively constant cross-sectional area.

4. The housing as recited in claim 1, wherein the first sealing lip extends in a direction of the cover such that a movement of the cover in the closing direction exerts a pressure load on the first sealing lip in the closing direction and wherein the first sealing lip transfers the pressure load to the electrical connection.

5. The housing as recited in claim 1, further comprising a third sealing lip disposed on an opposite side of the first sealing lip with respect to the second sealing lip.

6. The housing as recited in claim 1, wherein the sealing material includes an elastomer.

7. The housing as recited in claim 6, wherein the elastomer is a thermoplastic elastomer.

8. A housing, for an electronic device comprising:
at least one housing wall defining a housing inside and a housing outside, the housing wall including a hollow space;
a cover;
at least one electrical connection electrically connecting the housing inside with the housing outside and passing through the hollow space and through a passage in the housing wall such that the housing wall sheaths the electrical connection; and,
a sealing material disposed in the hollow space and sealing off the passage and extending beyond an end of the housing wall toward the cover so as to seal off the end of the housing wall using the cover and wherein the sealing material forms at least two sealing lips on a side facing the cover,
wherein the cover is configured to be disposed on the end of the at least one housing wall in a closing direction and wherein at least two sealing lips includes a first sealing lip disposed parallel to the closing direction and a second sealing lip disposed obliquely to the closing direction, and
wherein a movement of the cover in the closing direction exerts a pressure load on the second sealing lip in the closing direction so as to bend a free end towards the housing wall in the closing direction and in a direction perpendicular to the closing direction and away from the first closing lip.

* * * * *